United States Patent [19]

Monma et al.

[11] Patent Number: 5,751,112
[45] Date of Patent: May 12, 1998

[54] CRT MAGNETIC COMPENSATING CIRCUIT WITH PARALLEL AMORPHOUS WIRES IN THE SENSOR

[75] Inventors: Akio Monma; Yasunori Yamanobe, both of Ichikawa; Takashi Sato, Inba-gun, all of Japan

[73] Assignee: Sumitomo Metal Mining Co., Ltd., Tokyo, Japan

[21] Appl. No.: 698,389

[22] Filed: Aug. 15, 1996

Related U.S. Application Data

[63] Continuation of PCT/JP95/02563, Dec. 14, 1995.

[30] Foreign Application Priority Data

Dec. 22, 1994 [JP] Japan ................. 6-319825

[51] Int. Cl.$^6$ .................................. H04N 9/29
[52] U.S. Cl. ..................... 315/8; 361/150; 348/820; 324/244
[58] Field of Search .................. 315/8, 85; 361/150; 348/820; 324/244, 256, 258, 260

[56] References Cited

U.S. PATENT DOCUMENTS

| | | | |
|---|---|---|---|
| 4,657,605 | 4/1987 | Ogasawara et al. | 148/304 |
| 4,939,459 | 7/1990 | Akachi et al. | 324/258 X |
| 4,996,461 | 2/1991 | Bentley | 315/8 |
| 5,017,832 | 5/1991 | Takita | 315/8 |

FOREIGN PATENT DOCUMENTS

| | | |
|---|---|---|
| 45-41137 | 12/1970 | Japan. |
| 60-160791 | 8/1985 | Japan. |
| 61-245002 | 10/1986 | Japan. |
| 62-239020 | 10/1987 | Japan. |
| 63-22064 | 9/1988 | Japan. |
| 64-1981 | 1/1989 | Japan. |
| 1-155282 | 6/1989 | Japan. |
| 3-124866 | 5/1991 | Japan. |
| 3-252577 | 11/1991 | Japan. |
| 7-333305 | 12/1995 | Japan. |

*Primary Examiner*—Robert Pascal
*Assistant Examiner*—Justin P. Bettendorf
*Attorney, Agent, or Firm*—Cushman, Darby & Cushman IP Group of Pillsbury, Madison & Sutro, LLP

[57] ABSTRACT

A magnetic compensating circuit includes a magnetic sensor (1), a control circuit (2) for generating a signal for magnetic compensation, and coils (3) for magnetic compensation. The magnetic sensor has a pair of amorphous magnetic substance wires (101) arranged in parallel, coils (102) for providing the pair of amorphous magnetic substance wires with bias magnetic fields in directions opposite to each other, a high-frequency power source (105) for supplying the pair of amorphous magnetic substance wires with high-frequency currents, and circuits (106, 107, 108, 109) for outputting a potential difference derived from the output of the pair of amorphous magnetic substance wires. Thus, this magnetic compensating circuit is capable of detecting a minute external magnetic field with high accuracy.

5 Claims, 3 Drawing Sheets

CRT MAGNETIC COMPENSATING CIRCUIT WITH PARALLEL AMORPHOUS WIRES IN THE SENSOR

This is a Continuation of International Application No. PCT/JP95/02563 filed Dec. 14, 1995 which designated the U.S.

TECHNICAL FIELD

This invention relates to a magnetic compensating circuit for performing the detection of terrestrial magnetism, magnetism generated by the constituent parts of an apparatus, such as a TV, and magnetism generated by a magnetic sensor itself (hereinafter referred to as "external magnetism") and generating magnetism in accordance with the amount of detected magnetism to thereby compensate the external magnetism and prevent the shift of the position where an electron beam is radiated and variation in the purity (color purity) of an image display, such as a CRT, and to an image display using the magnetic compensating circuit.

BACKGROUND ART

As magnetic sensors for detecting terrestrial magnetism (tens of thousands of nanoteslas, or several tens of amperes per meter) with high accuracy, flux-gate magnetic sensors have been known in the past. The flux-gate magnetic sensor requires a large-sized magnetic core in principle, and thus it is impossible to diminish its sensor head. Hence, there is a question as to the use of this sensor as a magnetic detecting sensor for the magnetic compensating circuit which prevents variation in the purity of an image display. Furthermore, the flux-gate magnetic sensor involves high costs and thus is not suitable for mass production.

With the exception of such a flux-gate type, magnetic sensors are available in a hole element using a semiconductor and a magnetoresistive element using a thin film of a ferromagnetic substance. Each of these magnetic sensors, however, is less sensitive to the detection of a magnetic field, and requires an expensive sensor element and a complicated circuit for use as the magnetic detecting sensor for the magnetic compensating circuit which prevents variation in the purity of an image display, thus causing high costs. Consequently, the compensating circuits capable of compensating the external magnetism with high accuracy have been merely incorporated in some image displays of high grade.

Moreover, the conventional magnetic sensor, when its maximum permissible signal level is set to the extent of the terrestrial magnetism (tens of thousands of nanoteslas, or several tens of amperes per meter), has the problem of degrading the accuracy of magnetic detection.

It is, therefore, an object of the present invention to provide a magnetic compensating circuit which has accuracy sufficient to detect a minute external magnetic field even after an apparatus, such as a TV, is manufactured and which is compact in design and low in cost.

Another object of the present invention is to provide an image display equipped with the magnetic compensating circuit according to the present invention.

DISCLOSURE OF INVENTION

The magnetic compensating circuit of the present invention has a magnetic sensor, a control circuit for generating a signal for magnetic compensation, and coils for magnetic compensation so that the amount of external magnetism is detected by the magnetic sensor, the signal for magnetic compensation is generated by the control circuit in accordance with the amount of detected external magnetism, the signal is fed to the coils for magnetic compensation to generate a predetermined amount of magnetism in the direction in which the magnetic sensor senses the magnetism, and thereby the external magnetism is compensated. The magnetic sensor is equipped with a pair of amorphous magnetic substance wires arranged in parallel, coils or permanent magnets for providing the pair of amorphous magnetic substance wires with bias magnetic fields in directions opposite to each other, a high-frequency power source for supplying the pair of amorphous magnetic substance wires with high-frequency currents, and circuits for outputting a potential difference derived from the outputs of the wires.

Further, the magnetic compensating circuit according to the present invention includes two or three sets of combinations of the magnetic sensor and the coils for magnetic compensation so that these sets are arranged perpendicular to one another.

Still further, the image display according to the present invention is equipped with these magnetic compensating circuits.

The magnetic sensor detects the amount of external magnetism, while the control circuit generates the signal for magnetic compensation in accordance with the amount of external magnetism detected by the magnetic sensor. The signal is fed to the coils for magnetic compensation to generate a predetermined amount of magnetism in the direction in which the magnetic sensor senses the magnetism. In this way, the external magnetism is compensated so that, for example, the shift of the position where an electron beam is radiated and variation in the purity of an image display are prevented.

BEST MODE FOR CARRYING OUT THE INVENTION

In accordance with the drawings shown, the present invention will be explained in more detail below.

Figure 1:
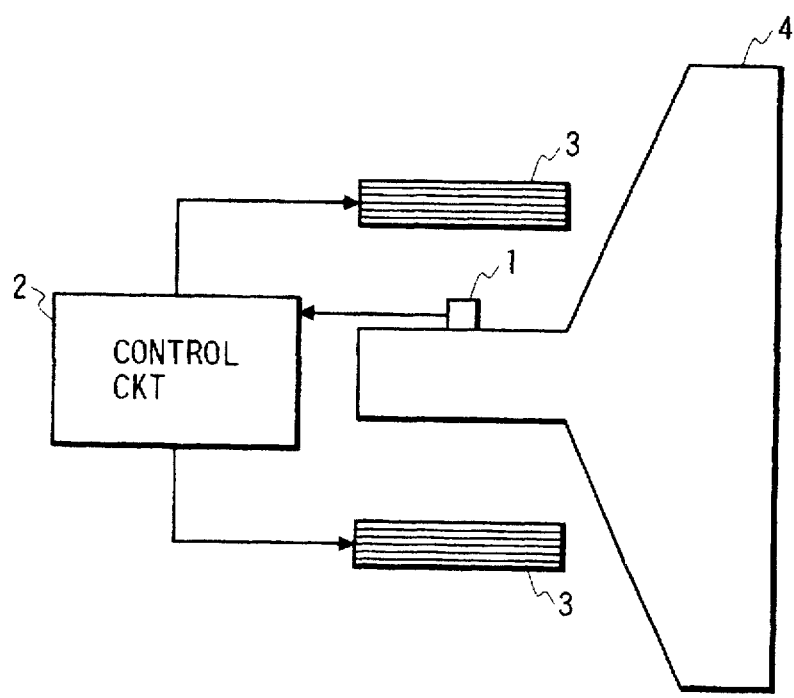
FIG. 1 is a circuit diagram showing an example of the arrangement of the magnetic compensating circuit and the image display according to the present invention.

In FIG. 1, reference numeral 1 represents a magnetic sensor mounted to a portion of the electron gun of an image display 4 like a CRT; 2 represents a control circuit for generating a signal for magnetic compensation, connected to the output terminal of the magnetic sensor 1; and 3 represents coils for generating a compensated magnetic field having magnetism in the same direction, connected to the output terminals of the control circuit 2 and arranged opposite to each other in the same plane, adjacent to the electron gun of the CRT 4.

Figure 2:
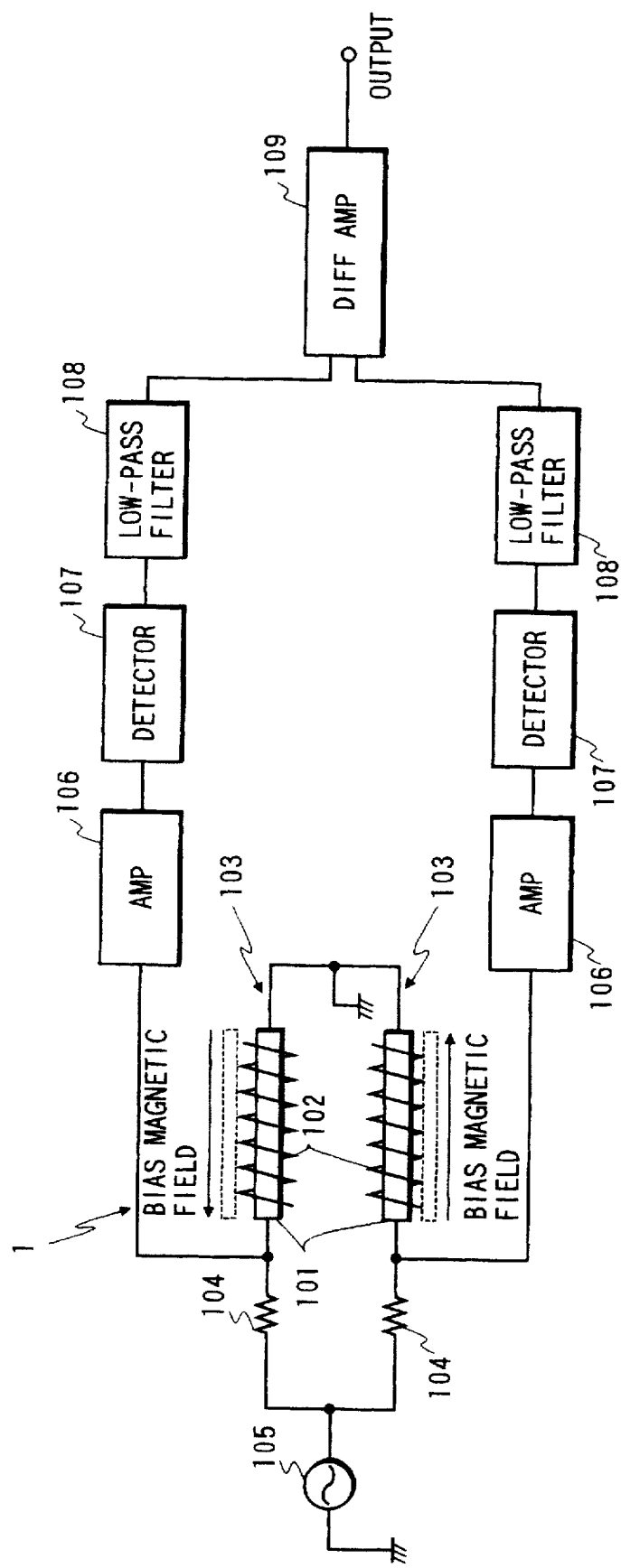
FIG. 2 is a view showing an example of the circuit configuration of a magnetic sensor used in the present invention.

In FIG. 2, reference numeral 101 denotes amorphous magnetic substance wires; 102, coils for providing the amorphous magnetic substance wires 101 with bias magnetic fields; 103, external-magnetism detecting sections, each composed of the amorphous magnetic substance wire 101 and the coil 102; 104, resistors; 105, a high-frequency power source for feeding a high-frequency current to each of the amorphous magnetic substance wires 101; 106, amplifiers; 107, detectors; 108, low-pass filters; and 109, a differential amplifier. The external-magnetism detecting sections 103, as shown in the figure, are connected in parallel with respect to the high-frequency power source 105, together with the resistors 104, and are arranged parallel to each other. An output signal from each of the amorphous magnetic substance wires 101 is taken out from a connection with the resistor 104 and is inputted into the amplifier 106.

Each of the amorphous magnetic substance wires 101 used in the present invention is such that CoSiB-base, FeCoSiB-base, or other base alloy, after being melted, is super-quenched and linearized. Moreover, to adjust the magnetostrictive constant and magnetic anisotropy of the wire, annealing is applied to the wire under tension, and thus the wire 101 has a strong magnetic anisotropy along its peripheral direction. For a magnetostrictive constant $\lambda s$, if its absolute value is more than $10^{-6}$, a voltage developed across the wire, which will be described later, will decrease and becomes difficult to detect. Hence, it is desirable to use the magnetostrictive constant defined as $-10^{-6} < \lambda s \leq 0$. It is favorable that the diameter of the amorphous magnetic substance wire 101 is in the range of 10~150 μm because it is highly sensitive to detection, and that its length, although usable with about 1 mm, is at least 2 mm in view of the ease with which the output is performed.

Each of the coils 102 is of a known type and instead of this, a known permanent magnet, as indicated by a broken line of FIG. 2, or a combination of the known coil and the known permanent magnet may be used. In order to bring about effective changes of impedance, it is desirable that a frequency f of the high-frequency current for energizing the amorphous magnetic substance wire 101 is in the range of 10 Khz~300 MHz, depending on the material of the wire 101 and the construction of the magnetic sensor 1. Beyond this range, sensitivity to the magnetic field is considerably reduced.

The magnetic compensating circuit according to the present invention is constructed as mentioned above, and subsequently, its function will be explained.

When the high-frequency current flows from the high-frequency power source 105 through each of the amorphous magnetic substance wires 101 in its longitudinal direction, a voltage is created between the ends of the wire 101 and at the same time, a circumferential magnetic field $H_0$ is produced in the periphery of the wire 101. The wire 101, which is a magnetic substance, has an inherent inductance L and a direct-current resistance R (also including resistance to an eddy-current loss). Here, when an external magnetic field $H_{ex}$ is applied to the wire 101 along its longitudinal direction, a magnetizing vector M of the wire 101 is inclined by an angle $\phi$ ($0° < \phi < 90°$) according to the strength of the external magnetic field $H_{ex}$. Consequently, an effective magnetizing component in the peripheral direction becomes M cos $\phi$ (0 < cos $\phi$ < 1), and the inductance L and the direct-current resistance R are reduced.

Hence, the strength of the external magnetic field $H_{ex}$ applied in the longitudinal direction of the amorphous magnetic substance wire 101 can be detected from the change of the impedance, which is found from the change of the voltage developed across the wire when the high-frequency current flows along the longitudinal direction of the wire 101.

Figure 3:
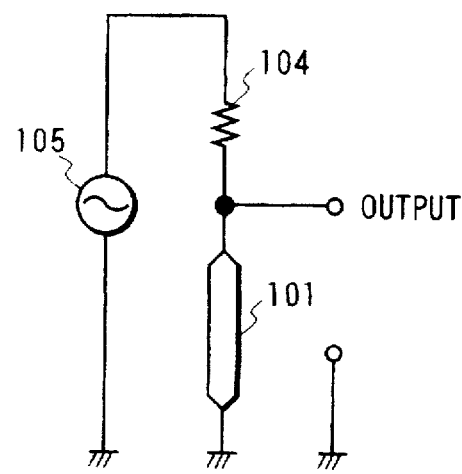
FIG. 3 is a view showing an example of the configuration of a fundamental circuit for measuring a voltage developed across an amorphous magnetic substance wire when an external magnetic field is applied to the wire along its longitudinal direction and a high-frequency current flows through the wire.
Figure 4:
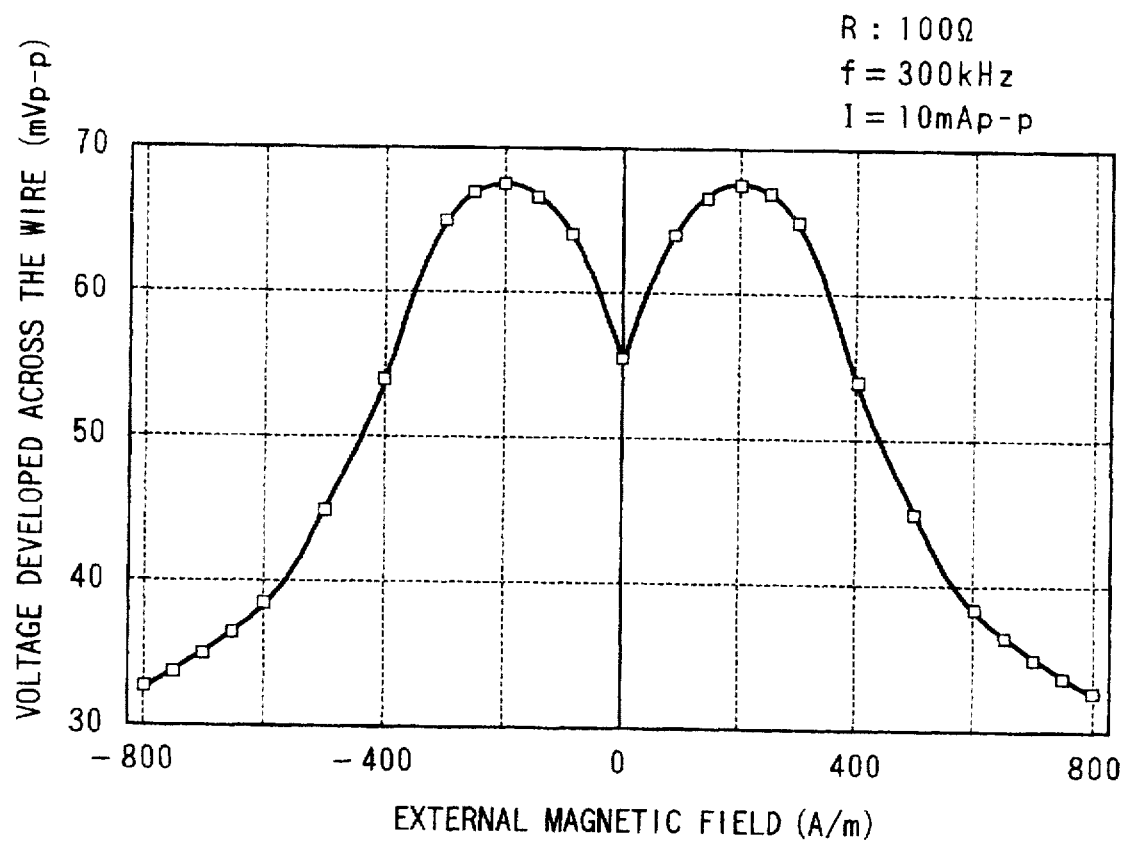
FIG. 4 is a graph showing the relationship between the voltage developed across the wire and the external magnetic field which are measured by the measuring circuit of FIG. 3.

FIG. 3 shows a fundamental circuit for measuring a voltage $mV_{p-p}$ developed across the wire when the external magnetic field $H_{ex}$ A/m is applied in the longitudinal direction of the wire 101 and the high-frequency current from the high-frequency power source 105 flows through the wire 101. FIG. 4 shows the change of the voltage $mV_{p-p}$ developed across the wire versus the external magnetic field $H_{ex}$ A/m in the case where the resistor 104 of 100 (Ω) is connected in series to the amorphous magnetic substance wire 101 whose composition is (Fe6Co94)72. 5Si12. 5B15 and the frequency of the high-frequency current is 300 kHz.

In the graph of FIG. 4, when the external magnetic field $H_{ex}$ is about ±200 A/m, the voltage developed across the wire is maximized and exhibits a curve symmetrical with respect to the boundary of the external magnetic field $H_{ex}=0$. The curve of this graph varies with the material and shape of the amorphous magnetic substance wire 101 and with the frequency and capacity of the current flowing through the wire 101. In any case, however, a mountain-shaped curve is obtained which is symmetrical about the axis of ordinates at the external magnetic field $H_{ex}=0$. Consequently, where the voltage developed across the wire is 55 $mV_{p-p}$ or more, the strength of the external magnetic field $H_{ex}$ is not uniformly determined and hence the external magnetic field $H_{ex}$ cannot be detected.

Thus, in the present invention, the magnetic detecting sections 103 are arranged parallel to each other and a high-frequency current of 10~300 kHz flows through each of the amorphous magnetic substance wires 101. Furthermore, bias magnetic field which are equal in strength and reverse in direction are generated by a pair of coils 102, and using the circuits indicated by blocks in FIG. 2, the potential difference between the ends of each of the amorphous magnetic substance wires 101 is detected to find the strength of the external magnetic field $H_{ex}$ in the longitudinal direction of each of the magnetic detecting sections 103 and the orientation thereof. Specifically, in FIG. 4, if, for example, the bias magnetic fields are set to +500 A/m and −500 A/m, the curve can be used in the ranges of +300~+500 A/m and −200~−500 A/m. Further, if the potential difference between the ends of a pair of wires is found, the curve can be used in the range of ±300 A/m. in this way, the strength and orientation of the external magnetic field $H_{ex}$ can be measured. The detection accuracy of the magnetic sensor 1 on these conditions is within ±A/m, and where the maximum permissible signal level corresponds to the magnitude of the terrestrial magnetism, a complete magnetic detection sensitivity has been obtained.

In this way, a signal representing the potential difference between the ends of the pair of wires derived from the output of the differential amplifier 109 is inputted into the control circuit 2, from which a signal for magnetic compensation of a level corresponding to the input signal is outputted to each of the coils 3 so that the external magnetic field is properly compensated. In this case, with a maximum permissible signal level of ±300 A/m, the magnetism compensation of an accuracy of ±1 A/m is possible.

Subsequently, a description is made of experimental results based on the above embodiment.

The orientation of a compensated magnetic field generated by the coils 3 for magnetic compensation is adjusted to the direction of detection of the magnetic sensor 1, and thereby the magnetic field generated by the coils 3 can also be detected at the magnetic sensor 1. When the compensation of the magnetic field is performed in this way, the magnetic compensating circuit is operated automatically until a combination of the compensated magnetic field generated by the coils 3 and the external magnetic field becomes zero (A/m).

Each of the amorphous magnetic substance wires 101 used has the composition of (Fe6Co94)72. 5Si12. 5B15, the magnetostrictive constant $\lambda s$ of $-10^{-7}$, a diameter of 50 μm, and an effective length of 4 mm. The coils 102 used to apply the bias magnetic fields are each 100 turns and 3 mm in coil diameter, and generate bias magnetic fields of ±500 A/m. Each of the resistors 104 are 270Ω, and the frequency f of the high-frequency current flowing through each of the wires 101 is 300 kHz.

The magnetic sensor 1 satisfying the above conditions is manufactured with the dimensions of the magnetic detecting sections 103 of 10×10×5 mm and the entire dimensions of 30×30×5 mm. The orientation of the magnetic field detected by the magnetic sensor 1 is taken as a vertical direction in which the terrestrial magnetism is strong, while that of the magnetic field generated by the coils 3 for magnetic compensation is taken as a vertical direction in which the magnetic sensor 1 can detect the magnetic field.

Each coil 3 for magnetic compensation is such that an enameled wire 0.1 mm thick is wounded into a coil of 100 turns, and has a square of 100×100 mm. The CRT 4 is 17 in. in size.

As a result, even when the magnetic field of 300 A/m is applied from the exterior, variation in purity is not produced and a fair image is obtained.

In the embodiment, as mentioned above, the magnetic sensor 1 is such that the amorphous magnetic substance wires 101 arranged in parallel on one plane (the plane of the page) are used in one set, and the coils 3 for magnetic compensation vertically arranged on one plane (the plane of the page) are used in one set in such a manner that the electron gun of the CRT 4 is interposed between them. However, these can also be arranged on two or three planes perpendicular to one another, one set for each. Such an arrangement is more desirable for the magnetic detection of the image display because the magnetic field derived from the terrestrial magnetism and the parts of the image display has a horizontal component and a vertical component.

Each of the coils 3 for magnetic compensation can be changed into various sizes and shapes in accordance with the place where the magnetic field is compensated, and may be freely designed in accordance with the construction of the image display.

Industrial Applicability

The magnetic compensating circuit according to the present invention, as mentioned above, can be designed to be extremely small in size, and the image display using this circuit brings about a fair image without producing the shift of the position where an electron beam is radiated and variation in the purity of the CRT. The present invention will in the future contribute largely to the industrial field of image display in which an image quality is being much improved.

We claim:

1. A magnetic compensating circuit comprising:

a magnetic sensor;

a control circuit for generating a signal for magnetic compensation; and coils for magnetic compensation, wherein an amount of external magnetism is detected by said magnetic sensor, the signal for magnetic compensation is generated by said control circuit in accordance with the amount of detected external magnetism, the signal is fed to said coils for magnetic compensation to generate a predetermined amount of magnetism in a direction in which said magnetic sensor senses the magnetism, and thereby the external magnetism is compensated, said magnetic sensor including a pair of amorphous magnetic substance wires arranged in parallel; coils or permanent magnets for providing said pair of amorphous magnetic substance wires with bias magnetic fields in directions opposite to each other; a high-frequency power source for supplying said pair of amorphous magnetic substance wires with high-frequency currents; and circuits for outputting a potential difference derived from an output of said pair of amorphous magnetic substance wires.

2. A magnetic compensating circuit according to claim 1, wherein said magnetic sensor and said coils for magnetic compensation are combined into two or three sets so that sets of said magnetic sensor and said coils are arranged perpendicular to one another.

3. A magnetic compensating circuit according to claims 1 or 2, wherein each of said amorphous magnetic substance wires is composed of (Fe6Co94)72. 5Si12. 5B15.

4. An image display having a magnetic compensating circuit comprising:

a magnetic sensor;

a control circuit for generating a signal for magnetic compensation; and coils for magnetic compensation, wherein an amount of external magnetism is detected by said magnetic sensor, the signal for magnetic compensation is generated by said control circuit in accordance with the amount of detected external magnetism, the signal is fed to said coils for magnetic compensation to generate a predetermined amount of magnetism in a direction in which said magnetic sensor senses the magnetism, and thereby the external magnetism is compensated, said magnetic sensor including a pair of amorphous magnetic substance wires arranged in parallel; coils or permanent magnets for providing said pair of amorphous magnetic substance wires with bias magnetic fields in directions opposite to each other; a high-frequency power source for supplying said pair of amorphous magnetic substance wires with high-frequency currents; and circuits for outputting a potential difference derived from an output of said pair of amorphous magnetic substance wires.

5. An image display according to claim 4, wherein said magnetic compensating circuit is constructed so that said magnetic sensor and said coils for magnetic compensation are combined into two or three sets so that sets of said magnetic sensor and said coils are arranged perpendicular to one another.

* * * * *